April 5, 1966 A. S. FARBER 3,244,905

TUNNEL DIODE LOGICAL CIRCUIT

Filed Oct. 30, 1962

INVENTOR
ARNOLD S. FARBER
BY S. P. Tedesco
ATTORNEY 3,244,905
Patented Apr. 5, 1966

3,244,905

TUNNEL DIODE LOGICAL CIRCUIT

Arnold S. Farber, Yorktown Heights, N.Y., assignor to International Business Machines Corporation, New York, N.Y., a corporation of New York Filed Oct. 30, 1962, Ser. No. 234,033
19 Claims. (Cl. 307—88.5)

This invention relates to logical circuits and, more particularly, to tunnel diode logical circuits adapted for synchronous operation.

Tunnel diode devices have received wide acceptance in the present technology due to an inherent negative resistance characteristic, very fast switching speeds, smallness of size, low power dissipation, and low sensitivity to environmental conditions; i.e. temperature variation, radiation, etc. The very fast switching speeds, i.e. in the order of one nanosecond, exhibited by tunnel diodes is primarily due to a "quantum-mechanical" tunnelling of majority carriers across a very thin semiconductor junction defined between two very highly doped semiconductor regions; theoretically "tunnelling" of majority carriers across the thin semiconductor junction occurs at the speed of light but switching speed is practically limited by junction capacitance and circuit parameters.

Due to the aforementioned characteristics, tunnel diodes can be employed advantageously as active elements in logical circuit arrangements. Numerous examples of tunnel diode logical circuits are known in the prior art. For example, R. H. Bergman in his article "Tunnel Diode Logic Circuits" which appeared in the IRE Transactions on Electronic Computers, vol. EC–9, No. 4, December 1960, pages 430 through 438, shows logical circuit arrangements comprising a single tunnel diode. Also, E. Goto et al. in their article, "Esaki Diode High Speed Logical Circuits" which appeared in the IRE Transactions on Electronic Computers, March 1960, pages 25 through 29, show logical circuit arrangements comprising two tunnel diodes of similar characteristics and arranged in tandem or "twin" fashion.

The philosophy of design of tunnel diode logical circuits differs from that of logical circuits employing other electrical circuit elements. As the tunnel diode is a two-terminal element, the input and output terminals of prior art tunnel diode logical circuits are identical. Accordingly, majority, or threshold, logic techniques have been employed wherein the analog sum of a number of binary information signals, e.g. positive for binary "1" and negative for binary "0," is generated in the input circuit and applied as a control signal at the "input terminal." Logic is actually performed in the input circuit when generating the analog sum of the information signals. The tunnel diode arrangement proper only amplifies the analog sum thus generated, the amplified output or logical operator being provided at the "output terminal." When such techniques are employed, however, variations in amplitude of the information signals are additive in the input circuit and reflected in the analog sum; such variations can be of sufficient magnitude to reverse the polarity of the analog sum or control signal and cause false operation of the logical circuit. Accordingly, tolerance requirements of tunnel diode logical circuits are extremely stringent and the allowable number of logical inputs to said circuits is seriously limited.

An object of this invention is to provide an improved tunnel diode logical circuit having less stringent tolerance requirements.

Another object of this invention is to provide a tunnel diode logical circuit wherein majority logic techniques are not utilized and information signals are appled individually at input terminals isolated one from the other; accordingly, variations in amplitude of information signals are not additive and tolerance requirements of the logical circuit are loosened.

Another object of this invention is to provide a tunnel diode logical circuit wherein the input and output terminals are not identical.

Another object of this invention is to provide a tunnel diode logical circuit wherein the logic and amplification function are performed in an integrated arrangement.

Generally, prior art tunnel diode logical circutis have been employed in synchronous systems and can be considered as comprising a resistive network to generate the analog sum of a plurality of information signals and a tunnel diode arrangement for amplifying said sum. In accordance with the principles of this invention, however, each of these functions are combined in an integrated tunnel diode logical circuit arrangement which defines a plurality of electrically-isolated input terminals to which informtaion signals are individually applied. Accordingly, generation of the analog sum of the information signals is avoided and circuit tolerances are loosened. A loosening of circuit tolerances is reflected in allowable variations in (1) the input/output signal amplitude of the logical circuit; (2) current-voltage characteristics of the tunnel diode devices employed therein; and (3) the amplitude of the power supply signal of the synchronous system.

In accordance with an illustrative embodiment of this invention, each of the input terminals of a tunnel diode logical circuit is defined at the junction of a tunnel diode-resistor series arrangement. A plurality of tunnel diode-resistor arrangements are connected in parallel; the resistors are multipled to a common tunnel diode similarly poled with respect to the paralleled tunnel diodes. The junction of the resistors and the common tunnel diode defines the output terminal of the tunnel diode logical circuit.

Each of the individual resistors is effective to isolate the corresponding input terminal from the other input terminals and also the output terminal of the tunnel diode logical circuit. Accordingly, Kirchhoff addition or analog summation of the information signals applied concurrently to the individual input terminals is avoided. Rather, when an information signal of predetermined polarity is applied at any one of the input terminals, each of the parallelled tunnel diodes switches to a high voltage state whereby an output signal of particular polarity is generated at the output terminal. Conversely, when information signals of opposite polarity are applied at each input terminal concurrently, the common tunnel diode only switches to a high voltage state whereby an output signal of opposite polarity is generated at the output terminal. Accordingly, the tunnel diode arrangement is adapted to generate logical operators and, since the individual input terminals are isolated, has looser tolerance requirements than prior art tunnel diode logical circuits.

The foregoing and other objects, features and advantages of the invention will be apparent from the following more particular description of preferred embodiments of the invention as illustrated in the accompanying drawings.

FIGS. 3, 4, 5, and 6 illustrate tunnel diode logical circuits embodying the principles of this invention for generating logical OR, AND, NOR, and NAND operators, respectively.

Figure 1:
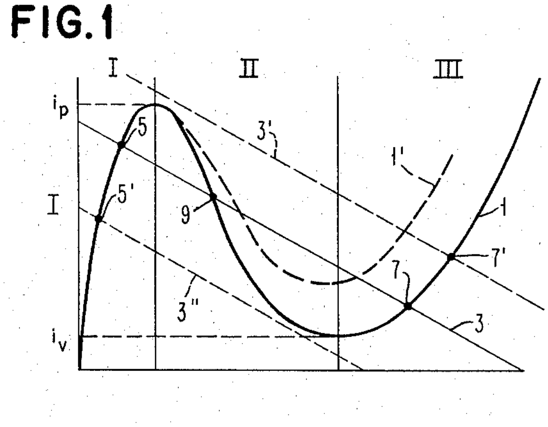
FIG. 1 illustrates the current-voltage characteristics of a tunnel diode, slightly idealized.

The current-voltage characteristics of a tunnel diode are illustrated by curve 1 in FIG. 1. When biased in a forward direction, a tunnel diode exhibits a current rise to a maximum peak current $i_p$ along a low voltage region I, a current drop along a "negative resistance" region II to a minimum valley current $i_v$, and a subsequent current rise along a "high voltage" region III of the curve 1. A tunnel diode is adapted for bistable operation when static load line 3 is defined to intersect curve 1 along each of the regions I, II, and III. Intersections 5 and 7 of load line 3 with regions I and III, respectively, define stable operating points; intersection 9 of load line 3 with region II defines an unstable operating point. A tunnel diode is switched between stable operating points 5 and 7 when load line 3 is displaced upwardly or downwardly to define a single operating point along either region I or region III, respectively, of curve 1. For example, while a tunnel diode is operating at point 5, momentarily increasing current through the tunnel diode in excess of the peak current $i_p$ elevates load line 3, as indicated by the dashed line 3', to define a single operating point 7' along region III; conversely, while a tunnel diode is operating at point 7, momentarily decreasing current through the tunnel diode below the valley current $i_v$ lowers load line 3, as indicated by the dashed line 3'', to define a single operating point 5' along region I. When returned to a quiescent state, the operation of the tunnel diode travels along portions III and I, respectively, to stable operating points 7 and 5.

Figure 2:
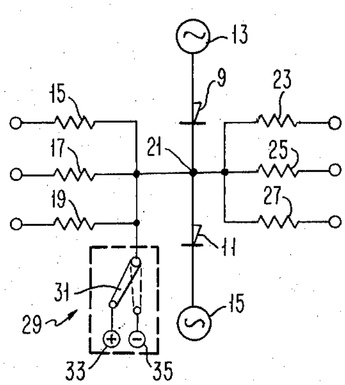
FIG. 2 illustrates a prior art tunnel diode logical circuit employing majority logic techniques.

The basic tunnel diode logical OR "twin" circuit as proposed by Goto et al. is illustrated in FIG. 2. The "twin" arrangements comprises a first tunnel diode 9 and a second tunnel diode 11 connected in series and selected to have a same peak current $i_p$ rating. As the "twin" arrangement is normally employed in a synchronous system, power supplies 13 and 15 periodically supply exciting voltages $+v$ and $-v$ of equal magnitude and opposite polarity to the anode of diode 9 and the cathode of diode 11, respectively.

A fan-in circuit comprising resistors 15, 17, and 19 and also a fan-out circuit comprising resistors 23, 25, and 27 is connected to junction 21 of tunnel diodes 9 and 11. Junction 21 serves as both the input terminal and the output terminal of the "twin" arrangement. In a synchronous system, each of the resistors 15 through 19 and 23 through 27 are connected to junction 21 of similar logical circuit arrangements in preceding and succeeding phase groups, respectively. The operation of tunnel diode logical circuits in a synchronous system is, for example, described in the above-identified Goto et al. article.

Depending on the magnitude of the exciting voltages $+v$ and $-v$, the voltage at junction 21 is capable of exhibiting three distinct responses. When the difference between voltages $+v$ and $-v$ is small, current flow along tunnel diodes 9 and 11 is less than the peak current $i_p$ and the potential at junction 21 is substantially zero volts. At this time, diodes 9 and 11 are operating along region I of curve 1. As the difference between voltages $+v$ and $-v$ increases, current through each of the diodes 9 and 11 increases toward the peak current $i_p$. Under these conditions, a small control signal applied at junction 21 can determine which of diodes 9 and 11 first switches to a high voltage operation along region III of curve 1. This control signal is derived from the analog summation of information signals, e.g. positive for binary "1" and negative for binary "0," directed along resistors 15 through 19 from logical circuit arrangements, not shown, in a preceding phase group. Depending on the polarity of the control signal, current through only one of the tunnel diodes 9 or 11 is increased and current through the other tunnel diode is decreased. For example, when the analog sum of the information signals is positive, current flows into junction 21 and current through diode 11 only is increased in excess of the peak current $i_p$; conversely, when the analog sum of the information signals is negative current through diode 9 only is increased in excess of the peak current $i_p$. A switching of either of the tunnel diodes 9 or 11 to the high voltage state reduces current along the "twin" below the peak current $i_p$ and precludes the other tunnel diode from switching to a high voltage state.

Hence, it is possible for the tunnel diode logical circuit of FIG. 2 to operate in any one of three states: (1) tunnel diodes 9 and 11 are both operating in the low voltage state and junction 21 is at substantially zero volts; (2) diode 9 is operating in the high voltage state and junction 21 is at a negative potential; and (3) diode 9 is operating in the low voltage state and diode 11 is operating in the high voltage state and junction 21 is at a positive potential. The polarity of the voltage at junction 21 is determined by the polarity of the analog sum of the information signals. Logic is performed by the input circuit comprising resistors 15, 17, and 19 in generating the analog sum of the information signals and tunnel diodes 9 and 11 only amplify the analog sum thus generated at the junction 21.

Heretofore, logical OR and also logical AND have been regarded as a special case of majority logic, i.e. N-out-of-M functions. To this end, a reference or bias signal of predetermined magnitude and polarity is applied at junction 21 concurrently with the information signals directed along the input circuit. For purposes of illustration, a bias source indicated by a dotted enclosure 29 includes a switch 31 along which junction 21 is connected to either a positive signal source 33 or a negative signal source 35. This bias signal enters into the analog addition to an extent necessary to generate a particular logical operator. For example, to generate a logical OR operator, the bias signal is positive and of a magnitude to insure that the analog sum or control signal at junction 21 is positive when a binary "1," or positive information signal, appears along any one of the resistors 15, 17, and 19. Conversely, to generate a logical AND operator, the bias signal is negative and of a magnitude to insure that the control signal at junction 21 is positive when binary "1" signals are directed along resistors 15, 17, and 19 concurrently. In each case, tunnel diode 11 switches to the high voltage state and junction 21 swings positive to indicate the particular logical operator. The magnitude of the bias signal applied to junction 21 from sources 33 and 35 is $(n-1)$ times greater than the amplitude of the information pulses, $n$ being the number of logical inputs to the circuit.

The merit of the logical circuit of FIG. 2 depends primarily on the uniformity of the current-voltage characteristics of the tunnel diodes 9 and 11 and also on the power supply tolerances. Normally, accurate regulation of the power supplies 13 and 15 in a synchronous system is difficult. In addition, the characteristics of tunnel diodes vary with ageing. For example, as illustrated in FIG. 1, while the magnitude of peak current $i_p$ remains fairly constant, the high voltage characteristics of a tunnel diode can vary as illustrated by dashed curve 1'.

Variations in the magnitudes of the exciting voltages $+v$ and $-v$ and also the high voltage characteristics of diodes 9 and 11 can vary significantly the amplitude of information signal generated at junction 21. As information signals directed from a preceding phase group along resistors 17, 19, and 21 are additive at junction 21, the tolerances of such signals are extremely critical. For example, when the number of inputs to a logical circuit is large, it is conceivable that small variations in amplitude of the information signals, when added with the bias signal, could reverse the polarity of the control and generate an improper logical function. The tolerance requirements of a prior art tunnel diode logical circuit become more stringent as the number of logical inputs thereto is increased. When a logical operator is to be derived from a significant number of logical inputs, it has been necessary heretofore to generate a logical operator during two or more phases of the power supply cycle. Tolerance requirements of tunnel diode logical circuits are discussed by W. F. Chow in his article Tunnel Diode Circuitry which appeared in the IRE Transactions on Electrical Computers, September 1960.

Figure 3:
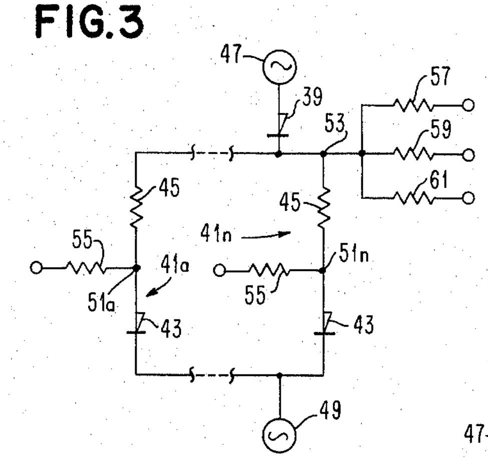

The tolerance requirements of tunnel diode logical circuits are loosened in accordance with the principles of this invention when, as shown in FIG. 3, an OR logical circuit comprises a tunnel diode 39 arranged in tandem with a number of parallelly-arranged tunnel diode-resistor arrangements 41*a* through 41*n*; arrangements 41 each comprises a tunnel diode 43 and a resistor 45. Alternatively, a resistor element can be substituted for diode 39 as described in the above-identified Bergman article. Corresponding terminals of resistors 45 are multiplied to the cathode of diode 39; diode 39 and diodes 43 are poled in a same direction. Power supplies 47 and 49 supply exciting voltages $+v$ and $-v$ of equal magnitude and opposite polarity to the anode of diode 39 and the cathodes of diodes 43, respectively. Diode 39 and diodes 43 are preferably selected such that peak current $i_p$ of diode 39 is just slightly in excess of the sum of the peak current $i_p$ of the diodes 43; also, resistors 45 are selected of equal magnitude.

An input terminal 51 is defined at the junction of resistor 45 and tunnel diode 43 in each of the arrangements 41*a* through 41*n*, respectively; an output terminal 53 is defined at the junction of diode 39 and resistors 45. Each input terminal 51 is connected along a resistor 55 to the output terminal 53 of a logical circuit, not shown, in a preceding phase group. Output terminal 53 is connected along a fan-out circuit, for example, comprising resistors 57, 59, and 61 to input terminals 51 of logical circuits, not shown, in a next successive phase group.

While the exciting voltages $+v$ and $-v$ are increasing, current through tunnel diode 39 and tunnel diodes 43 increases toward the respective peak currents $i_p$. When voltages $+v$ and $-v$ have reached a predetermined magnitude, a binary "1" or positive information signal, for example, applied at a single input terminal 51*a* increases current through diode 43*a* in excess of the characteristic peak current $i_p$ and, concurrently, reduces current through diode 39. Resistors 45 are preferably of low ohmic value such that, when diode 43*a* switches to the high voltage state, the resultant positive increase in potential at junction 51 is sufficient to overcome the binary "0" or negative information signals applied at each of the remaining input terminals 51 and increase current along remaining tunnel diode-resistor arrangements 41 in excess of the characteristic peak current $i_p$ of tunnel diodes 43. Resistors 45, in effect, prevent analog summation of information signals applied concurrently at each of the input terminals 51. Accordingly, a switching of one of the tunnel diodes 43 to the high voltage state results in a switching of each of remaining tunnel diodes 43 to the high voltage state. At this time, the potential at junction 53 swings positively and is indicative of a binary "1" or logical OR operator. It is evident that a similar operation results when binary "1" inputs are applied at two or all of the input terminals 51 concurrently.

When a binary "1" or positive information pulse is not applied at any of input terminals 51 of FIG. 3, tunnel diode 39 only switches to the high voltage state. For example, a binary "0" or negative information signal at junction 51*a* tends to decrease current flow through tunnel diode 43*a* and, concurrently, increases current flow through the tunnel diode 39. Accordingly, when voltage $+v$ and $-v$ have reached a predetermined magnitude and while binary "0" signals are applied at each input terminal 51, the resultant current through tunnel diode 39 is in excess of the peak current $i_p$. When diode 39 switches to the high voltage state, the potential at junction 53 swings negatively to indicate a binary "0" or absence of a logical OR operator. Accordingly, the circuit arrangement of FIG. 3 satisfies the well-known OR logical truth table in that the voltage at the junction 51 swings positively to indicate a binary "1" or logical OR operator whenever a binary "1" or positive information signal is applied at one, several, or all of input terminals 51 and swings negatively to indicate a binary "0" only when binary "0" or negative information signals are applied at each of the input terminals 51 concurrently.

Figure 4:
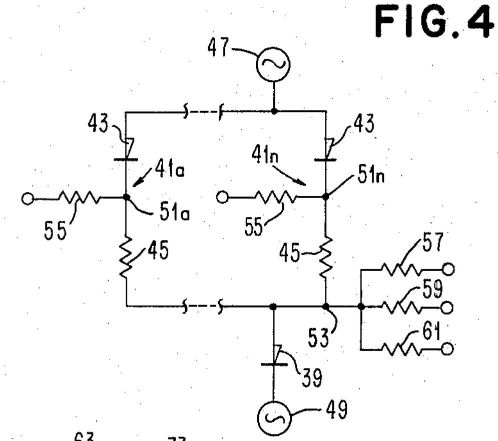

In FIG. 4, an AND logical circuit embodying similar principles is illustrated. In the interest of simplicity, corresponding circuit elements have been identified by the same reference character. In FIG. 4, the polarities of tunnel diode 39 and tunnel diode 43 and, also, power supplied 47 and 49 are reversed; also, input terminals 51 are defined at the junction of the cathodes of diodes 43 and resistors 45. A binary "1" or positive information signal applied at an input terminal 51, therefore, reduces current through connected diode 43 while increasing current through diode 39; conversely, a binary "0" or negative information signal increases current through connected diode 43 while reducing current flow through tunnel diode 39. Diode 39 switches to the high voltage state and the potential at junction 53 swings positively to indicate a binary "1" or logical AND operator if and only if binary "1" signals are applied concurrently at each of the input terminals 51. A binary "0" or negative information signal applied at any one of the input terminals 51, as hereinabove described, results in each of diodes 43 switching to the high voltage state, whereby the potential junction 53 swings negatively to indicate a binary "0." The circuit of FIG. 4, therefore, satisfies the AND logical truth table as a binary "1" signal is generated at junction 53 only when binary "1" signals are applied at each of the input terminals 51 concurrently.

It is evident that the tunnel diode logical circuits shown in FIGS. 3 and 4 can be employed to generate either the AND or OR logical operators, respectively, if the polarity of the information signals are reversed, i.e. negative for binary "1" and positive for binary "0." For example, the logical circuit of FIG. 4 generates a logical OR operator in a manner identical to that described with respect to FIG. 3 when binary "1" is indicated by a negative information signal. In this instance, a binary "1" signal applied at any input terminal 51 switches diodes 43 to the high voltage state and the potential at junction 53 swings negatively to indicate binary "1" or logical OR operator. Conversely, when binary "0" or positive information signals are applied at each of the input terminals 51, only diode 39 switches to the high voltage state and the potential at junction 53 swings positively to indicate a binary "0."

Figures 5, 6:
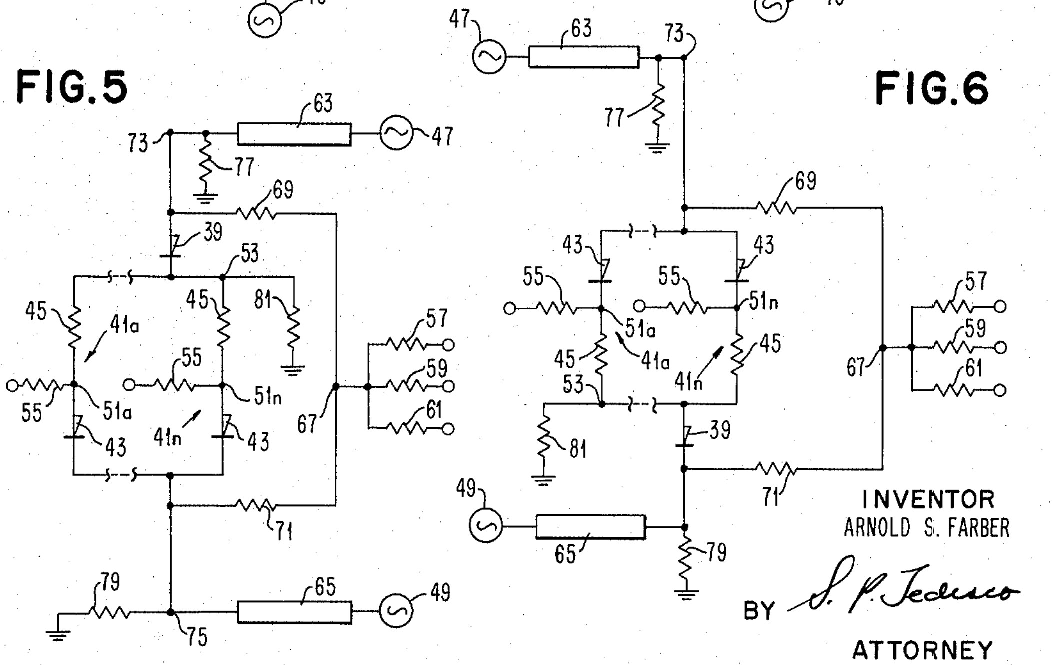

The basic structures of FIGS. 3 and 4 can be adapted as shown in FIGS. 5 and 6, respectively, to perform logical inversion, i.e. generate logical NOR and NAND operators, respectively. In FIGS. 5 and 6, power supplies 47 and 49 are connected at terminals 73 and 75 to tunnel diodes 39 and 43 along transmission lines 63 and 65. Transmission lines 63 and 65 as herein employed have been shown and described in the A. Farber, Patent 3,108,199, issued on October 2, 1963 and assigned to the same assignee as this invention. Transmission lines 63 and 65 distribute power from a central location to a number of logical circuits in a same phase group and, in addition, provide isolation so as to prevent transition of one logical circuit from influencing the decision of another logical circuit in the same phase group through the non-zero power supply impedance. Also, transients impressed on the transmission lines 63 and 65 when a connected diode switches to the high voltage state are reflected back after a delay equal to twice a transit time so as to return the tunnel diode to a low voltage state and thereby ease the tolerances on the amplitude of A.C. component of the power supply signal.

In FIGS. 5 and 6, the output terminal 67 of the logical circuit is defined at the junction of serially-arranged resistors 69 and 71. Resistors 69 and 71 are connected between terminals 73 and 75, respectively, which are returned to ground along resistors 77 and 79, respectively. Also, junction 53, which served previously as the output terminal is returned to ground along resistor 81; it is evident that resistor 81 could be employed as a logical coupling resistor whereby the arrangements can generate the straight logic and inversion functions concurrently. The output terminals 67 of FIGS. 5 and 6 are each capable of exhibiting three distinct responses. While the tunnel diode 39 and also tunnel diodes 43 are in a low voltage state, the potential at the output terminal 67 is substantially zero volts. The magnitude of current flow along the serially-arranged resistors 69 and 71, however, varies in accordance with whether tunnel diode 39 or tunnel diodes 43 are in the high voltage state. Variation in the magnitude of current along the serially-arranged resistors 69 and 71, however, swings the potential at an output terminal 67 either positively or negatively when diode 39 or diodes 43, respectively, switch to the high voltage state.

For example, referring to FIG. 5, consider that a binary "1" or positive information pulse has been applied at any one of input terminals 51 and diodes 43 have switched to the high voltage state. In the circuit of FIG. 3, such condition would result in the potential at output terminal 53 swinging positively to indicate a binary "1" or logical OR operator. In FIG. 5, however, the resultant impedance presented by diodes 43, now in the high voltage state, in series with resistor 81 is greater than that of tunnel diode 39, now in the low voltage state, in series with the same resistor 81. Accordingly, the negative excursion of the potential at terminal 75 is larger than the positive excursion of the potential at terminal 73 and output terminal 67 swings negatively to indicate a binary "0." Conversely, when binary "0" signals are applied at each of the input terminals 51, only tunnel diode 39 switches to the high voltage state. Accordingly, the positive excursion of the potential at terminal 73 is larger than the negative excursion of the potential at terminal 75 and the potential at the output terminal 67 swings positively to indicate a binary "1." Accordingly, the logical circuit as shown generates the logical NOR operator.

In FIG. 6, the polarities of tunnel diode 39 and tunnel diodes 43 and also the power supplies 47 and 49 have been reversed with respect to the showing of FIG. 5 (compare FIGS. 3 and 4). An operation similar to that described with respect to the circuit of FIG. 5 results. For example, consider that binary "1" signals have been applied at each of the input terminals 51 and tunnel diode 39 only has switched to the high voltage state. The negative excursion of the potential at terminal 75 is greater than the positive excursion of the potential at terminal 73 and the potential at output terminal 67, therefore, swings negatively to indicate a binary "0." Conversely, when a binary "0" signal is applied at any one of the input terminals 51 and diodes 43 have switched to the high voltage state, as hereinabove described, the potential at the output terminal swings positively to indicate a binary "1." Accordingly, the circuit as shown generates the logical NAND operator.

In each of the above-identified logical circuits, resistors 45, in effect, prevent identity of input and output terminals and also isolate the individual input terminals 51 one from the other. Accordingly, analog summation of information signals applied concurrently to input terminals 51 is avoided. Since tolerances of the information signals are not additive, the number of logical inputs to the logical circuit can be increased substantially over that number allowable in the prior art tunnel diode logical circuits and/or circuit tolerances can be reduced.

While the invention has been particularly shown and described with reference to preferred embodiments thereof, it will be understood by those skilled in the art that various changes in form and details may be made therein without departing from the spirit and scope of the invention.

What is claimed is:

1. In combination, a plurality of first electrical devices each exhibiting negative resistance characteristics and capable of assuming a low voltage and a high voltage state of operation, each of said first electrical devices capable of being switched from said low voltage state to said high voltage state of operation when current of a first predetermined magnitude is directed therethrough, said first electrical devices being connected in parallel and poled to conduct forward current in a same direction, input means connected one to each of said first electrical devices, said input means being capable of operating concurrently to apply first and second information signals to corresponding ones of said first electrical devices, application of a first input signal to a first electrical device being effective to increase current flow therealong in excess of said first predetermined magnitude, a switching of a single one of said first electrical devices to said high voltage state being effective to increase current flow along remaining ones of said first electrical devices in excess of said first predetermined magnitude whereby each of said remaining first electrical devices switches to said high voltage state.

2. In combination, a plurality of circuit arrangements each comprising a resistor in series with a tunnel diode capable of assuming a low voltage state and a high voltage state, said arrangements being connected in parallel such that said tunnel diodes are poled in a same direction, means for directing current along said paralleled circuit arrangements, and input means connected one to each of said circuit arrangements and capable of operating concurrently to apply information signals thereto for switching tunnel diodes in selected ones of said circuit arrangements to said high voltage state, each of said resistors being of a selected fixed magnitude such that the resultant current flow along remaining ones of said circuit arrangements is sufficient to switch said tunnel diodes included therein to said high voltage state.

3. The combination as set forth in claim 2 wherein each of said tunnel diodes has a same peak current rating.

4. The combination as set forth in claim 2 wherein said input means are individually connected intermediate said reistor and said tunnel diode in each of said circuit arrangements whereby input signals applied by each of said input means are not additive across said parallelled circuit arrangements.

5. A logical circuit comprising a plurality of parallelly-arranged tunnel diodes having substantially identical peak current ratings, each of said tunnel diodes being poled in a same direction and capable of assuming a high voltage and a low voltage state, means for directing current along said parallelly-arranged tunnel diodes, and a plurality of input means connected one to each of said tunnel diodes and capable of operating concurrently for individually switching said tunnel diodes to said high voltage state, a switching of one of said tunnel diodes to said high voltage state being effective to increase current along remaining ones of said tunnel diodes sufficiently to cause said remaining tunnel diodes to switch to said high voltage state.

6. A logical circuit comprising a first tunnel diode, a plurality of circuit arrangements each including a resistor in series with a second tunnel diode, the junction of said resistor and said second tunnel diode in each of said circuit arrangements defining an input terminal, said resistors being multipled and connected to said first tunnel diode, said first and said second tunnel diodes being similarly poled and capable of assuming a low voltage and a high voltage state, means for directing current along said first tunnel diode and said circuit arrangements, and input circuit means connected one at each of said input terminals so as to be isolated one from the other by said resistors and capable of operating concurrently whereby information signals applied by each of said input circuit means are not additive across said circuit arrangements.

7. The logical circuit as defined in claim 6 further including output terminal means connected at the juction of said resistors and first tunnel diode.

8. The logical circuit as defined in claim 6 further including tandemly arranged first and second resistors connected in parallel across said first tunnel diodes and said circuit arrangements, and output means connected at the junction of said first and said second resistors.

9. A logic circuit as defined in claim 6 wherein said resistors are of a magnitude such that switching of said second tunnel diode in a single one of said circuit arrangements to said high voltage stated is effective to increase current flow along remaining ones of said circuit arrangements sufficiently to switch said second tunnel diodes included therein to said high voltage state.

10. A logical circuit as defined in claim 9 wherein each of said input circuit means is operative to apply first and second information signals of opposite polarity at said connected input terminal, said first information signal being effective to increase current flow along the corresponding circuit arrangement in excess of the peak current rating of said second tunnel diode included therein whereby said second tunnel diode along with remaining ones of said second tunnel diodes switch to said high voltage state, said second information signal being effective to incrementally increase current flow along said first tunnel diode and decrease current flow along said corresponding circuit arrangement, current flow along said first tunnel diode exceeding the peak current rating only when second information signals are concurrently applied at each of said input terminals.

11. A logical circuit as defined in claim 10 wherein each of said second tunnel diodes are selected to have a same peak current rating and said first tunnel diode is selected to have a peak current rating which is substantially equal to the total peak current ratings of said second tunnel diodes.

12. A logical circuit comprising a first tunnel diode, a plurality of circuit arrangements each including a second tunnel diode and a resistor element joined at a junction defining an input terminal, said first tunnel diode having a higher peak current rating than any of said second tunnel diodes, means for multiplying said resistor elements to said first tunnel diode, said first and said second tunnel diodes being poled in a same direction and each capable of assuming a first and a second voltage state, means for directing current along said first tunnel diode and said circuit arrangements, and input means connected one at each of said input terminals and capable of operating concurrently for applying bipolar information signals indicative of binary quantities at said input terminals, information signals of a predetermined polarity being effective to switch said second tunnel diode in the associated circuit arrangement to said high voltage state, information signals of opposite polarity when applied at each of said input terminals concurrently being effective to switch said first tunnel diode to said high voltage state.

13. A logical circuit as defined in claim 12 wherein said resistors are of a magnitude such that when said second tunnel diode in one of said circuit arrangements is switched to high voltage state, resultant current flow along remaining ones of said circuit arrangements being sufficient to switch said second tunnel diodes to said high voltage state.

14. A logical circuit comprising a first tunnel diode and a parallel arrangement of second tunnel diodes being connected in series with said first tunnel diode and poled in the same direction, said first and said second tunnel diodes being capable of assuming a low and a high voltage state, means for supplying current along said first and said second tunnel diodes, an output terminal defined between said first and said second tunnel diodes, input means connected one to each of said second tunnel diodes and capable of operating concurrently for switching selected ones of said second tunnel diodes to said high voltage state, and means connected between each of said second tunnel diodes and said output terminal for isolating said input means one from the other whereby information pulses applied to each of said second tunnel diodes are not additive.

15. A logical circuit as defined in claim 14 wherein said isolating means includes a resistor connecting each of said second tunnel diodes to said output terminal.

16. A logical circuit as defined in claim 14 wherein said first tunnel diode has a higher current peak rating than any one of said second tunnel diodes.

17. A logical circuit as defined in claim 16 wherein the peak current rating of said first tunnel diode is substantially equal to the total of the peak current ratings of said second tunnel diodes.

18. A logical circuit comprising a first tunnel diode, a plurality of circuit arrangements each including a resistor and a second tunnel diode, each of said resistors being multipled to said first tunnel diode, said first and said second tunnel diodes being poled in a same direction and adapted to assume a first and a second voltage state, circuit means for directing current along said first tunnel diode and said circuit arrangements, input means connected one to each of said circuit arrangements at the junction of said resistor and said second tunnel diode whereby input signals supplied by said input means are not additive across said circuit arrangements, each of said input means being operative to switch said second tunnel diode in said connected circuit arrangement to said second voltage state, a switching of said second tunnel diode in a single one of said circuit arrangements being effective to increase current flow along remaining ones of said circuit arrangements sufficiently to switch said second tunnel diodes included therein to said second voltage state, a switching of said second tunnel diodes to said second voltage state being effective to reduce current along said circuit means and preclude switching of said first tunnel diode to said second voltage state, said input means being further operative concurrently to switch said first tunnel diode to said second voltage state so as to reduce current flow along said circuit means and preclude switching of said second tunnel diodes to said high voltage state.

19. In combination, a plurality of first electrical devices connected in parallel and an additional electrical device connected in series therewith, each of said first and said additional electrical devices being poled to conduct forward current in a same direction and exhibiting negative resistance characteristics so as to be capable of assuming a low voltage and a high voltage state of operation, each of said first electrical devices capable of being switched from said low voltage state to said high voltage state of operation when current of a first predetermined magnitude is directed therethrough, said additional electrical device capable of being switched from said low voltage to said high voltage state of operation when current of a second predetermined magnitude is directed therethrough, means for directing current along said first and said additional electrical devices, input means connected one to each of said first electrical devices and capable of operating concurrently to apply first and second information signals to corresponding ones of said first electrical devices, application of a first input signal to a first electrical device being effective to increase current flow therealong in excess of said first predetermined magnitude, a switching of a single one of said first electrical devices to said high voltage state of operation increasing current flow along remaining ones of said first electrical devices in excess of said first predetermined magnitude whereby each of said remaining first electrical devices switches to said high voltage state of operation, concurrent application of second information signals to each of said first electrical devices increasing current flow along said additional electrical device in excess of said predetermined magnitude whereby only said additional electrical device is switched to said high voltage state.

References Cited by the Examiner

UNITED STATES PATENTS

| | | | |
|---|---|---|---|
| 3,109,945 | 11/1963 | Riley | 307—88.5 |
| 3,125,689 | 3/1964 | Miller | 307—88.5 |

OTHER REFERENCES

The Review of Scientific Instruments, vol. 32, No. 11, November 1961, sheet 1222–1223, Tunnel Diodes Nanosecond Coincidence Circuit.

RCA Technical Notes, No. 515, March 1962, sheet 1 of 2, Two-Output Tunnel Diode Register.

JOHN W. HUCKERT, *Primary Examiner.*

DAVID J. GALVIN, *Examiner.*

A. J. JAMES, *Assistant Examiner.*